US009955593B2

United States Patent
Inoue et al.

(10) Patent No.: US 9,955,593 B2
(45) Date of Patent: *Apr. 24, 2018

(54) ELECTRONIC APPARATUS AND FABRICATION METHOD THEREFOR

(71) Applicant: SONY INTERACTIVE ENTERTAINMENT INC., Tokyo (JP)

(72) Inventors: Yukito Inoue, Tokyo (JP); Yasuhiro Ootori, Tokyo (JP)

(73) Assignee: SONY INTERACTIVE ENTERTAINMENT INC., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/466,877

(22) Filed: Mar. 23, 2017

(65) Prior Publication Data

US 2017/0196098 A1 Jul. 6, 2017

Related U.S. Application Data

(63) Continuation of application No. 14/891,680, filed as application No. PCT/JP2014/062251 on May 7, 2014, now Pat. No. 9,629,274.

(30) Foreign Application Priority Data

May 17, 2013 (JP) ................................. 2013-105607
Jun. 7, 2013 (JP) ................................. 2013-121344

(51) Int. Cl.
*H05K 5/00* (2006.01)
*H05K 7/00* (2006.01)
(Continued)

(52) U.S. Cl.
CPC ............ *H05K 5/0008* (2013.01); *H05K 5/03* (2013.01); *H05K 7/1427* (2013.01); *H05K 7/20145* (2013.01)

(58) Field of Classification Search
CPC . G06F 1/181–1/182; H05K 7/20218–7/20381;
(Continued)

(56) References Cited

U.S. PATENT DOCUMENTS 5,008,487 A * 4/1991 Shimmyo ............ H05K 5/0008
174/353
8,391,005 B2 * 3/2013 Monster ............... H02K 11/022
361/690

(Continued)

FOREIGN PATENT DOCUMENTS

CN        1321412 A    11/2001
CN        1327711 A    12/2001
(Continued)

OTHER PUBLICATIONS

Search Report dated Jul. 3, 2017 for corresponding EP application No. 14797639.3.

(Continued)

*Primary Examiner* — Anthony Haughton
*Assistant Examiner* — Razmeen Gafur
(74) *Attorney, Agent, or Firm* — HEA Law PLLC

(57) ABSTRACT

A plurality of parts built in an electronic apparatus are attached to a frame. Further, the frame has a peripheral wall portion formed along an outer peripheral face of the electronic apparatus. An upper cover has a rear face portion attached to a rear wall portion of the frame by a screw. Further, a lower cover has a rear face portion attached to the rear wall portion of the frame by a screw. With the structure, insertion locations of the fixtures such as screws can be suppressed from standing out.

23 Claims, 7 Drawing Sheets

(51) Int. Cl.
*H05K 5/03* (2006.01)
*H05K 7/14* (2006.01)
*H05K 7/20* (2006.01)

(58) Field of Classification Search
CPC ............... H05K 7/20409–7/20418; H05K 7/20009–7/202; H05K 5/00–5/069; H05K 7/00–7/186; H05K 5/0004; H05K 5/0008; H05K 5/0013; H05K 7/1427; H05K 7/1429; H05K 7/1431; H05K 7/1432; H05K 7/1434; H01L 23/367–23/3677; H01L 23/473; H01L 23/46–23/467
USPC ............. 361/679.01–679.45, 679.55–679.61, 361/676–678, 679.46–679.54, 688–727, 361/756, 741, 686, 687, 787, 789, 794, 361/807–810; 165/80.1–80.5, 104.33, 165/185; 174/15.1–15.3, 16.1–16.3, 547, 174/548; 257/712–722, E23.088; 348/787, 789, 794; 349/56–60
See application file for complete search history.

(56) References Cited

U.S. PATENT DOCUMENTS

| | | | | |
|---|---|---|---|---|
| 8,879,260 B2* | 11/2014 | Kalms | ............... | G06F 1/20 165/104.33 |
| 8,902,607 B1* | 12/2014 | Chang | ............... | G01R 31/2834 349/57 |
| 8,908,372 B1* | 12/2014 | West | ............... | H05K 7/20563 361/694 |
| 9,253,918 B2* | 2/2016 | Sarno | ............... | H05K 7/18 |
| 2003/0067747 A1* | 4/2003 | Hasegawa | ............... | H05K 7/20909 165/47 |
| 2005/0174723 A1* | 8/2005 | Chan | ............... | H05K 5/0008 361/600 |
| 2005/0178568 A1* | 8/2005 | Ito | ............... | H05K 5/0008 174/351 |
| 2006/0109615 A1* | 5/2006 | Kunimoto | ............... | H05K 5/0008 174/520 |
| 2006/0120035 A1* | 6/2006 | Merz | ............... | G02F 1/133308 361/679.34 |
| 2006/0133049 A1* | 6/2006 | Hagiwara | ............... | H01L 23/4338 361/720 |
| 2008/0074839 A1* | 3/2008 | Tamaki | ............... | G06F 1/20 361/679.46 |
| 2009/0148638 A1* | 6/2009 | Kishi | ............... | H05K 5/0013 428/35.7 |
| 2009/0279267 A1* | 11/2009 | Yi | ............... | H05K 5/0008 361/725 |
| 2010/0025126 A1* | 2/2010 | Nakatsu | ............... | B60L 11/00 180/65.1 |
| 2010/0091464 A1* | 4/2010 | Ohnishi | ............... | H01L 23/053 361/723 |
| 2010/0246135 A1* | 9/2010 | Hongo | ............... | H01L 23/12 361/707 |
| 2011/0157832 A1* | 6/2011 | Hongo | ............... | H01L 23/40 361/707 |
| 2011/0222244 A1* | 9/2011 | Takashiro | ............... | H02M 7/003 361/704 |
| 2011/0273848 A1* | 11/2011 | Soma | ............... | H05K 7/1417 361/720 |
| 2011/0304989 A1* | 12/2011 | Ootomo | ............... | H05K 7/1404 361/704 |
| 2012/0250255 A1* | 10/2012 | Shigeno | ............... | H05K 7/20918 361/692 |
| 2012/0262878 A1* | 10/2012 | Ikeda | ............... | G06F 1/20 361/695 |
| 2012/0262879 A1* | 10/2012 | Inoue | ............... | G06F 1/20 361/697 |
| 2013/0003267 A1* | 1/2013 | Pan | ............... | H04M 1/026 361/679.01 |
| 2013/0033829 A1* | 2/2013 | Furubo | ............... | A63F 13/08 361/752 |
| 2013/0321989 A1* | 12/2013 | Uesugi | ............... | H05K 5/068 361/679.01 |
| 2014/0160683 A1* | 6/2014 | Snider | ............... | H04B 1/082 361/709 |
| 2015/0022974 A1* | 1/2015 | Nakatsu | ............... | B60L 11/00 361/699 |

FOREIGN PATENT DOCUMENTS

| | | |
|---|---|---|
| CN | 101861085 A | 10/2010 |
| DE | 3603915 A1 | 8/1987 |
| EP | 0607879 A1 | 7/1994 |
| JP | H06188581 A | 7/1994 |
| JP | 2002185157 A | 6/2002 |
| JP | 2008010769 A | 1/2008 |

OTHER PUBLICATIONS

Office Action dated Jan. 17, 2018, for corresponding CN Patent Application No. 201480026518.0 and English translation thereof.
Office Action dated Jan. 17, 2018, for corresponding CN Patent Application No. 201480026516.1 and English translation thereof.

* cited by examiner

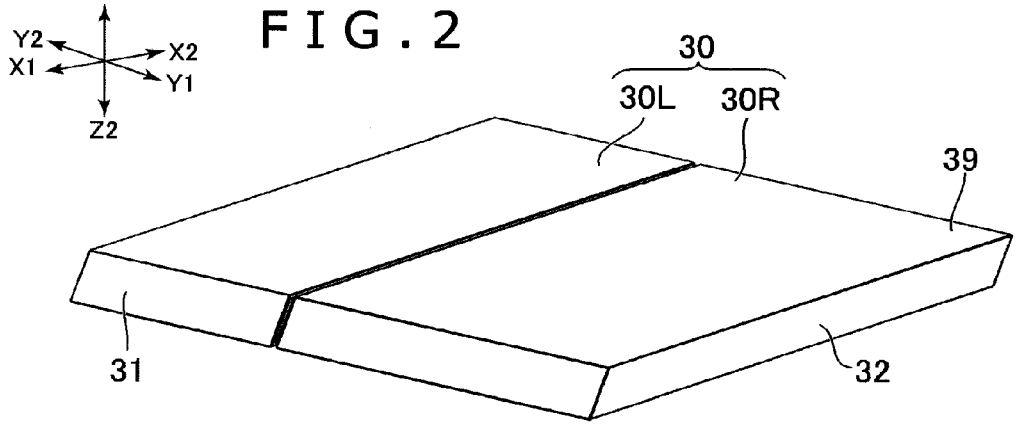
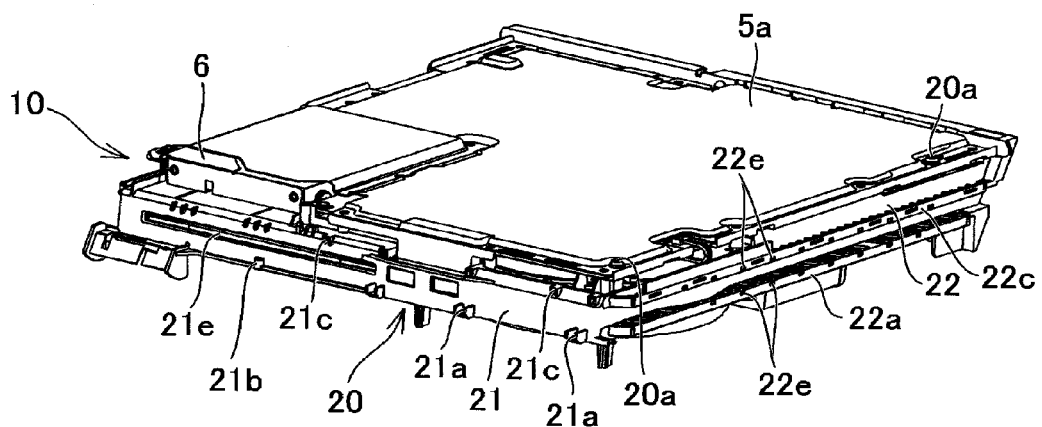
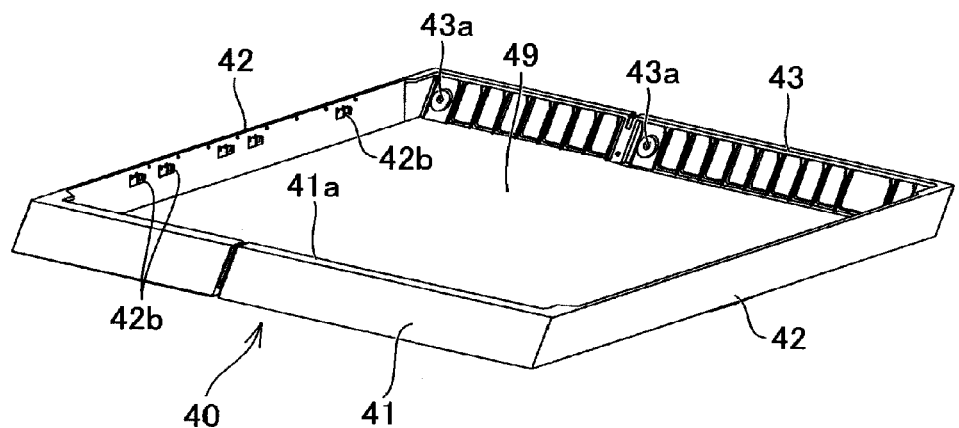
FIG.2

ELECTRONIC APPARATUS AND FABRICATION METHOD THEREFOR

CROSS REFERENCE TO RELATED APPLICATIONS

This application claims priority to and is a continuation of U.S. application Ser. No. 14/891,680 filed on Nov. 17, 2015 which is a National Stage of International Application No. PCT/JP2014/062251 filed on May 7, 2014, which claims priority to Japanese Patent Application No. 2013-105607 filed on May 17, 2013, and Japanese Patent Application No. 2013-121344 filed on Jun. 7, 2013. The contents of each of the above documents are incorporated herein by reference in their entirety.

TECHNICAL FIELD

The present invention relates to an attachment structure of a part which configures an electronic apparatus.

BACKGROUND ART

An electronic apparatus disclosed in U.S. Pat. No. 7,755,896 has an upper housing and a lower housing which are combined with each other in an upward and downward direction. Various parts built in the electronic apparatus such as a circuit board and a cooling fan are fixed on the inner side of the lower housing and are covered with the upper housing. Attachment holes for screws are formed on a lower face of the electronic apparatus, and the upper housing and the lower housing are fixed to each other by screws inserted in the attachment holes.

SUMMARY

Incidentally, some electronic apparatus is placed in a posture (horizontal placement) in which the lower face thereof is positioned on the lower side and another posture (vertical placement) in which the upper face and the lower face are directed in a horizontal direction. When the electronic apparatus is placed vertically, the insertion locations of the screws provided on the lower face stand out. That the insertion locations of the screws stand out is not favorable in appearance.

An electronic apparatus according to the present disclosure has, on an outer face thereof, an outer face including a first face, a second face which is a face on an opposite side to the first face, and an outer peripheral face which is a face which surrounds the electronic apparatus when the electronic apparatus is viewed in a first direction which is a direction in which the first face and the second face oppose to each other. The electronic apparatus further has a first cover having a first face portion which configures the first face and covers a plurality of parts built in the electronic apparatus and a peripheral face portion which configures an outer peripheral face, a second cover having a second face portion which configures the second face and covers the plurality of parts and a peripheral face portion which configures the outer peripheral face, and a frame having a peripheral wall portion formed along the outer peripheral face of the electronic apparatus and surrounding the plurality of parts and having the plurality of parts attached thereto. Each of the peripheral face portion of the first cover and the peripheral face portion of the second cover includes a portion located from the frame in a second direction orthogonal to the first direction, and the portion is fixed to the peripheral wall portion of the frame by a fixture.

A fabrication method for an electronic apparatus according to the present disclosure includes a step of preparing a first cover having a first face portion for configuring the first face and a peripheral face portion for configuring an outer peripheral face, a step of preparing a second cover having a second face portion for configuring the second face and a peripheral face portion for configuring the outer peripheral face, a step of preparing a frame having a peripheral wall portion formed so as to extend along an outer peripheral face, a step of disposing a plurality of parts on an inner side of the peripheral wall portion and attaching the plurality of parts to the frame, a step of covering the plurality of parts and the frame with the first cover, a step of covering the plurality of parts and the frame with the second cover, and a step of fixing each of the peripheral face portion of the first cover and the peripheral face portion of the second cover to the peripheral wall portion of the frame by a fixture at a portion located from the frame in the second direction orthogonal to the first direction.

With the electronic apparatus and the fabrication method of the present, disclosure, insertion locations of fixtures such as screws are not exposed on the first face and the second face of the electronic apparatus. Therefore, when the electronic apparatus is disposed such that one of the first face and the second face is directed upwardly, the insertion locations of the fixtures can be suppressed from standing out. Also when the electronic apparatus is disposed such that the first face and the second face are directed horizontally, the insertion locations of the fixtures can be suppressed from standing out. Further, in the present invention, the parts provided in the electronic apparatus are attached to the frame. Since the frame has the peripheral wall portion provided thereon, the rigidity of the frame can be assured. Therefore, in comparison with the conventional structure wherein parts are attached to an exterior member (in the conventional structure, the housing), the rigidity or the attachment strength required for the exterior member (in the present invention, the first and second covers) can be lowered. As a result, the number of fixtures required for fixation of the first and second covers can be reduced, and the insertion locations of the fixtures can be suppressed from standing out.

BRIEF DESCRIPTION OF DRAWINGS

FIG. 2 is an exploded perspective view of the electronic apparatus.

FIG. 5(a) is a sectional view taken along line Va-Va of FIG. 1, and FIG. 5(b) is a sectional view taken along line Vb-Vb of FIG. 1.

DESCRIPTION OF EMBODIMENTS

Figure 1:
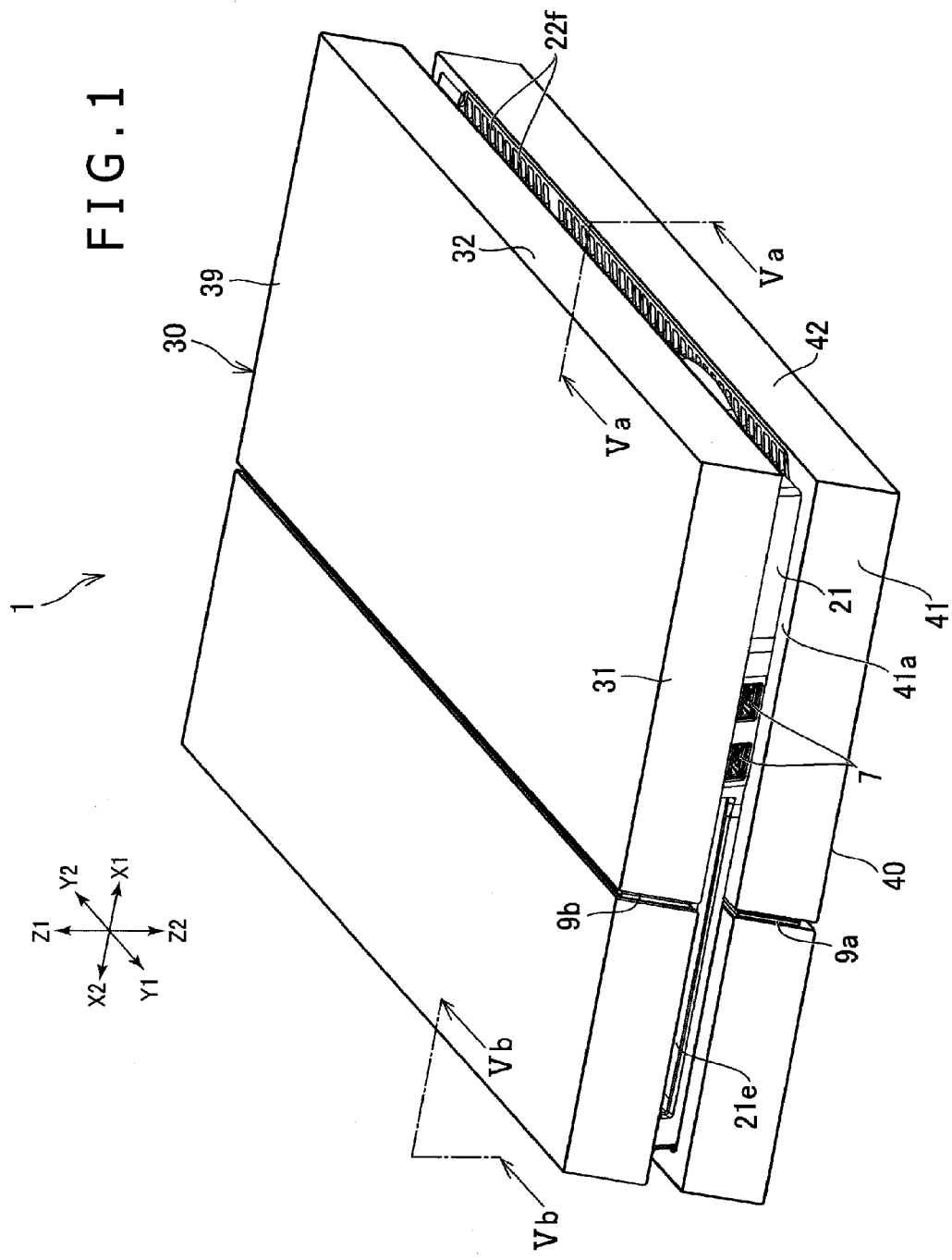
FIG. 1 is a perspective view of aft electronic apparatus according to an embodiment of the present invention.
Figure 3:
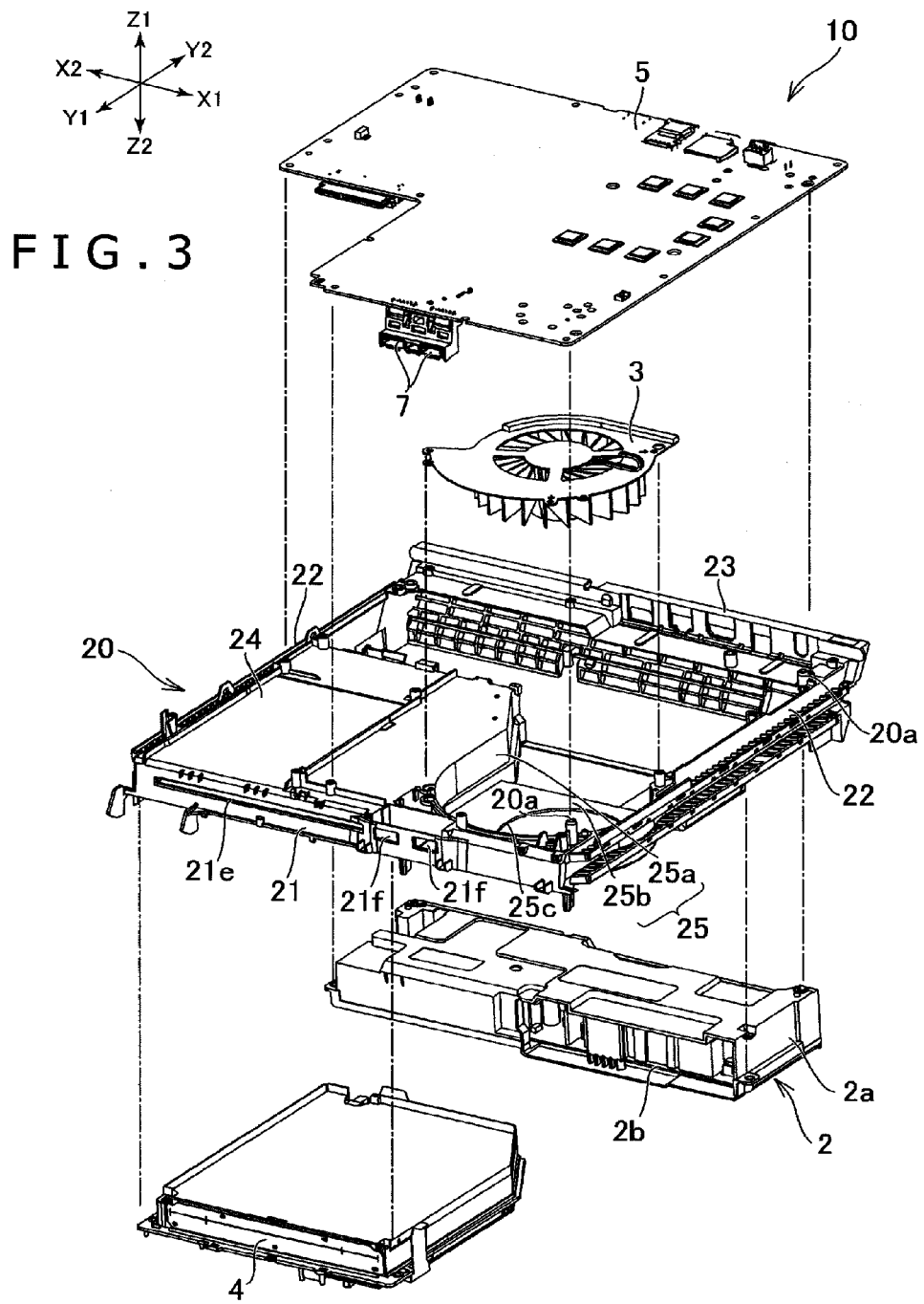
FIG. 3 is an exploded perspective view of a main body of the electronic apparatus.
Figure 4:
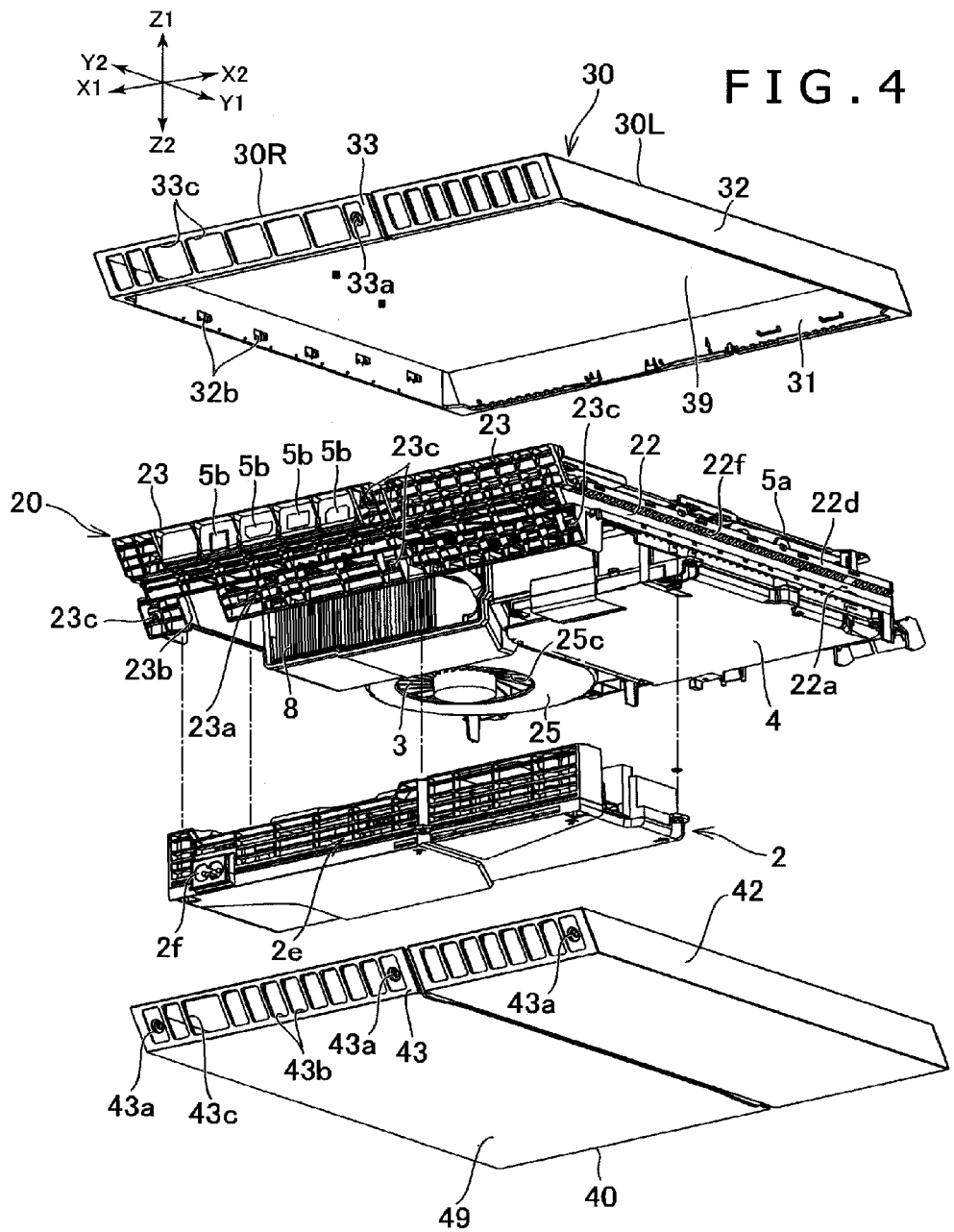
FIG. 4 is an exploded perspective view of the electronic apparatus and depicts the rear side of the main body and a cover of the electronic apparatus.
Figure 5:
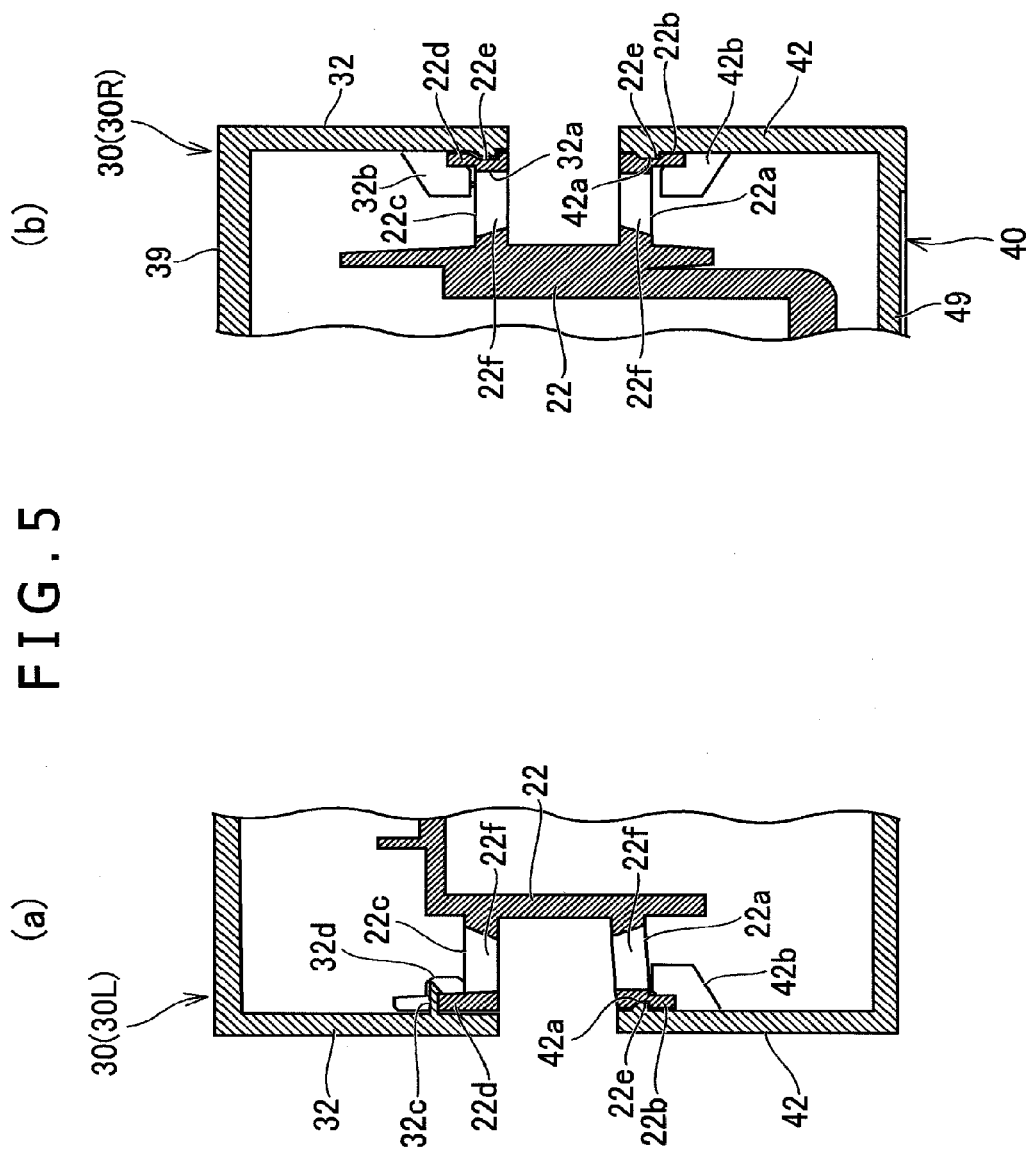
FIG. 5 is a set of sectional views of the cover and a frame.
Figure 6:
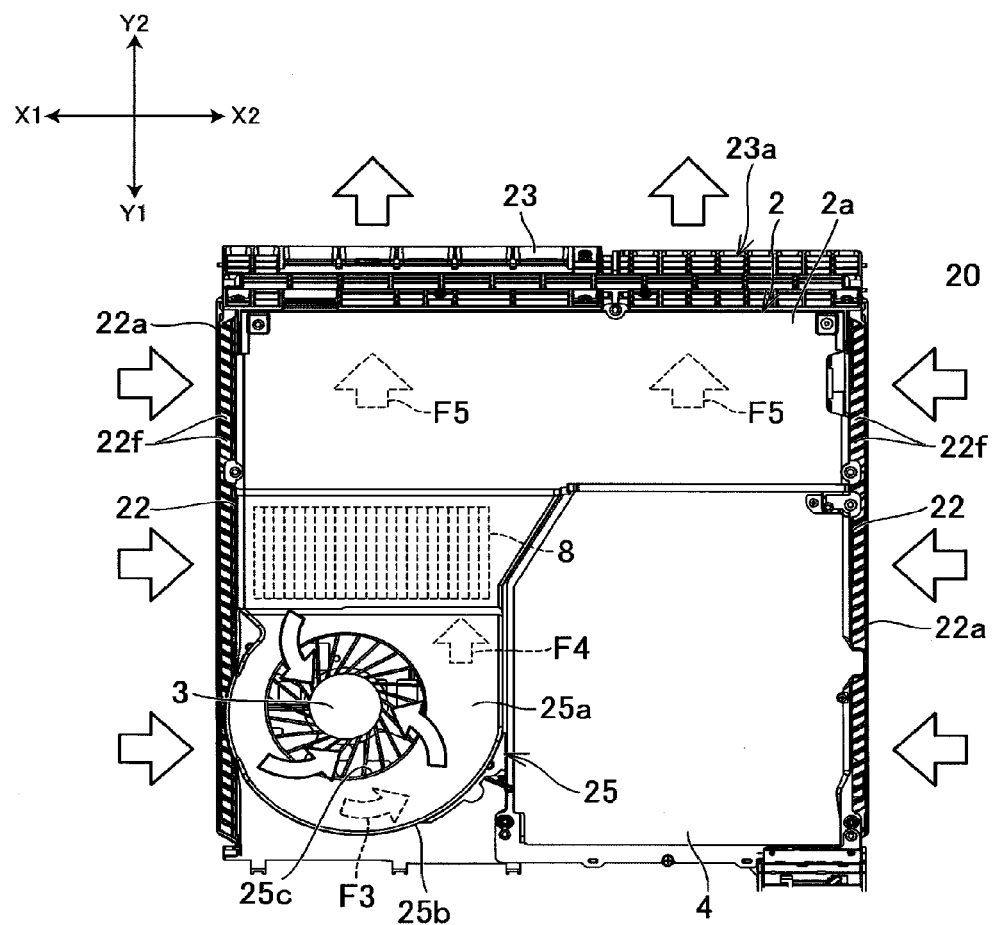
FIG. 6 is a bottom plan view of the frame to which a cooling fan and a power supply unit are attached.
Figure 7:
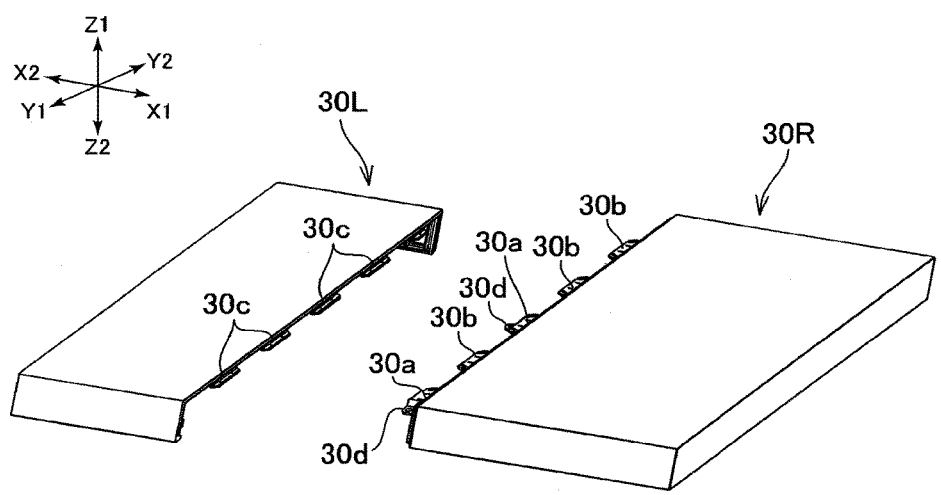
FIG. 7 is an exploded view of an upper cover.

In the following, an embodiment of the present invention is described with reference to the drawings. FIG. 1 is a perspective view of an electronic apparatus 1 according to the embodiment of the present invention. FIG. 2 is an exploded perspective view of the electronic apparatus 1, and in FIG. 2, covers 30 and 40 which configure the electronic apparatus 1 and a main body 10 of the electronic apparatus 1 are depicted. FIG. 3 is an exploded perspective view of the main body 10 of the electronic apparatus 1. FIG. 4 is an exploded perspective view of the electronic apparatus 1, and in FIG. 4, the rear side of the covers 30 and 40 and the main body 10 which configure the electronic apparatus 1 is depicted. FIG. 5 is sectional views of the covers 30 and 40 and a frame 20. FIG. 5(a) is a sectional view taken along line Va-Va of FIG. 1. FIG. 5(b) is a sectional view taken along line Vb-Vb of FIG. 1. FIG. 6 is a bottom plan view of the frame 20 to which a cooling fan 3 and a power supply unit 2 are attached. FIG. 7 is an exploded view of the upper cover 30. In the following description, X1 and X2 depicted in FIG. 1 represent a leftward direction and a rightward direction, respectively; Y1 and Y2 represent a forward direction and a rearward direction, respectively; and Z1 and Z2 represent an upward direction and a downward direction, respectively. It is to be noted that the upward and downward direction of the present embodiment corresponds to the "first direction" in the claims. Further, the rearward direction of the present embodiment corresponds to the "second direction" in the claims.

The electronic apparatus is, for example, a game apparatus, an audio-visual apparatus or a personal computer. The electronic apparatus 1 depicted in FIG. 1 is an entertainment apparatus which functions as a game apparatus or an audio-visual apparatus. The electronic apparatus 1 outputs moving picture data generated by execution of a game program, video-audio data acquired through a network or video-audio data acquired from a recording medium such as an optical disk to a display apparatus such as a television unit.

On a front face of the electronic apparatus 1, an insertion slot 21e for inserting an optical disk therethrough and connectors 7 for connecting an apparatus such as a controller. Further, on the front face of the electronic apparatus 1, a power supply button 9b and an eject button 9a for ejecting an optical disk are provided.

As depicted in FIG. 2, the electronic apparatus 1 has a main body 10, an upper cover 30 which covers the upper side of the main body 10, and a lower cover 40 which covers the lower side of the main body 10. The main body 10 includes a frame 20 and a plurality of parts built in the electronic apparatus 1. In the example described here, parts necessary for executing functions of the electronic apparatus 1 described hereinabove such as reproduction of a moving picture (parts which configure the main body 10) are all fixed to the frame 20. In particular, the main body 10 has, as depicted in FIG. 3, a power supply unit 2, a cooling fan 3, a circuit board 5, an optical disk drive 4 and a hard disk drive 6 (FIG. 2). On the circuit board 5, integrated circuits such as a CPU for controlling the entire electronic apparatus 1 and a memory are mounted. The circuit board 5 is disposed between shields 5a (refer to FIG. 2) formed from a pair of upper and lower metal plate members.

The general outer profile of the electronic apparatus 1 is a parallelepiped having six faces each of which has a quadrangular shape and each two opposing ones of which extend substantially in parallel to each other. Accordingly, the outer face of the electronic apparatus 1 has an outer peripheral face including a front face, left and right side faces and a rear face which surround the electronic apparatus 1 when the electronic apparatus 1 is viewed in the upward and downward direction. The electronic apparatus 1 of the example described here has a substantially parallelogrammic shape as viewed in side elevation. The other faces of the electronic apparatus 1 have a substantially rectangular shape. The frame 20 has a peripheral wall portion formed along the outer peripheral face of the electronic apparatus 1 and surrounding the plurality of parts described hereinabove. As depicted in FIG. 3, the peripheral wall portion has a front wall portion 21 extending along the front face of the electronic apparatus 1, left and right side wall portions 22 extending along the left side face and the right side face of the electronic apparatus 1, and a rear wall portion 23 extending along the rear face of the electronic apparatus 1. The wall portions 21, 22 and 23 are connected to each other at end portions thereof and configure a peripheral wall portion of a tubular shape as a whole. By configuring the frame 20 in this manner, the frame 20 of high rigidity can be implemented. The peripheral wall portion of the example described here has a substantially quadrangular tubular shape when the electronic apparatus 1 is viewed in the upward and downward direction. All parts such as the circuit board 5, the power supply unit 2, the cooling fan 3 and the optical disk drive 4 are disposed on the inner side of a region defined by the outer profile of the peripheral wall portion (the outer profile of the tube) when the frame 20 is viewed in the upward and downward direction. Particularly, in the example described here, the power supply unit 2, the cooling fan 3 and the optical disk drive 4 are disposed on the inner side of the peripheral wall portion (the wall portions 21, 22 and 23). The parts mentioned are attached to the frame 20 by fixtures such as screws. The power supply unit 2 is disposed in a region on the rear side in the inside of the peripheral wall portion. The cooling fan and the optical disk drive 4 are disposed in a region on the front side in the inside of the peripheral wall portion and are juxtaposed in the leftward and rightward direction. The circuit board 5 is disposed on the upper side of the peripheral wall portion as hereinafter described. The frame 20 is formed as a unitary member, for example, from a resin.

The upper cover 30 has an upper face portion 39 which covers the upper side of the main body 10 and configures the upper face of the electronic apparatus 1 (refer to FIG. 1). The upper cover 30 has a shape of a box open downwardly. In other words, the upper cover 30 has a peripheral face portion extending downwardly from an outer peripheral edge of the upper face portion 35. As depicted in FIGS. 2 and 4, in the example described here, the upper cover 30 includes a front face portion 31 which configures the front face of the electronic apparatus 1, left and right, side face portions 32 which configure the left and right side faces of the electronic apparatus 1, respectively, and a rear face portion 33 which configures the rear face of the electronic apparatus 1. It is to be noted that the peripheral face portion of the upper cover 30 configures an upper side portion of the outer peripheral face of the electronic apparatus 1 and surrounds an upper side portion of the frame 20. The lower cover 40 has a lower face portion 49 which covers the lower side of the main body 10 and configures the lower face of the electronic apparatus 1 (refer to FIG. 1). The lower cover 40 exhibits a shape of a box open upwardly. In other words, the lower cover 40 has a front face portion 41 which configures the front face of the electronic apparatus 1, left and right side face portions 42 which configure the left and right side faces of the electronic apparatus 1, respectively, and a rear face portion 43 which configures the rear face of the electronic apparatus 1. The front face portion 41, the side face portions 42 and the rear face portion 43 configure a peripheral face portion which stands on an edge of the lower face portion. The peripheral face portion of the lower cover 40 configures a lower side portion of the outer peripheral face of the electronic apparatus 1 and surrounds the lower side portion of the frame 20.

The upper cover 30 and the lower cover 40 are attached to the frame 20. The attachment location of the upper cover 30 to the frame 20 is provided on the peripheral face portion (31, 32 and 33) of the upper cover 30 described above. In the present example, only one of the front face portion 31, the side face portions 32 and the rear face portion 33 of the upper cover 30 is attached to the frame 20 by a screw. Also the attachment location of the lower cover 40 to the frame 20 is provided on the peripheral face portion of the lower cover 40. In the present example, only one of the front face portion 41, the side face portions 42 and the rear face portion 43 of the lower cover 40 is attached to the frame 20 by a screw.

Consequently, the insertion locations of the screws can be suppressed from being exposed on the upper face and the lower face of the electronic apparatus 1. As a result, even where the electronic apparatus is placed vertically, the insertion locations of the screws are less likely to be viewed by a user. Further, such parts as the power supply unit 2, the cooling fan 3 and the circuit board 5 are attached to the frame 20. Since the frame 20 includes the peripheral wall portion, the rigidity of the frame 20 can be assured. Therefore, in comparison with a conventional structure wherein parts are attached to an exterior member (in the conventional structure, the housing), the rigidity, attachment strength and so forth required for the exterior member (in the present embodiment, the covers 30 and 40) can be reduced. As a result, the number of screws required for fixation of the covers 30 and 40 can be reduced, and the insertion locations of the screws can be suppressed from standing out.

In the example described here, attachment holes 33a and 43a are formed on the rear face portion 33 of the upper cover 30 and the rear face portion 43 of the lower cover 40, which are located rearwardly from the frame 20, respectively, as depicted in FIG. 4. The rear face portions 33 and 43 are fixed to the frame 20 by screws inserted in the attachment holes 33a and 43a, respectively. The covers 30 and 40 are fixed to the main body 10 thereby. The rear wall portion 23 of the frame 20 has attachment holes 23c at positions corresponding to the attachment holes 33a and 43a. In the rear face portion 43 of the lower cover 40, a plurality of (three in the example of FIG. 3) attachment poles 43a are formed in a spaced relationship from each other in the leftward and rightward direction. One attachment hole 33a is formed in the rear face portion 33 of the upper cover 30. No attachment hole for a screw is provided on the peripheral face portion of the upper cover 30 except the rear face portion 33. Further, no attachment hole for a screw is provided in the peripheral face portion of the lower cover 40 except the rear face portion 43. The numbers of the attachment holes 33a and 43a are not limited to those described above, but a plurality of attachment holes 33a may be formed also in the rear face portion 33. At least one of the front face portion 31 and the side face portions 32 of the upper cover 30 engages with the frame 20. Similarly, at least one of the front face portion 41 and the side face portions 42 of the lower cover 40 engages with the frame 30.

In the example described here, a plurality of engaging portions 42a are provided on the left and right side face portions 42 of the lower cover 40 such that they project toward the inner side as depicted in FIGS. 5 (a) and 5(b). The plurality of engaging portions 42a are juxtaposed in a spaced relationship from each other in the forward and rearward direction. The side wall portions 22 of the frame 20 have recessed portions 22e (refer to FIG. 2) at positions corresponding to the engaging portions 42a. The plurality of engaging portions 42a respectively engage with the recessed portions 22e of the side wall portions 22. The frame 20 of the example described here have projecting portions 22a projecting from the side wall portions 22 to the outer sides in the leftward and rightward direction and extending in the forward and rearward direction (FIG. 2). The projecting portions 22e with which the engaging portions 42a engage are formed on an end face of the projecting portions 22a. The side face portions 42 of the lower cover 40 have a plurality of engaging portions 42b provided on an inner face thereof and having a substantially L shape. The plurality of engaging portions 42b are juxtaposed with each other in the forward and rearward direction. The projecting portions 22a of the frame 20 have a flange portion 22b provided at an end portion thereof and projecting downwardly. The flange portions 22b are fitted with the engaging portions 42b of the lower cover 40. By an action of the two engaging portions 42a and 42b, movement of the side face portions 42 of the lower cover 40 with respect to the side wall portions 22 of the frame 20 (movement in the upward and downward direction, leftward and rightward direction, and forward and rearward, direction) is restricted. It is to be noted that the engagement structure provided on the side face portions 42 is not limited to that described above.

As depicted in FIG. 2, the front face portion 41 of the lower cover 40 has, on an upper edge thereof, a projecting portion 41a in the form of a plate which projects toward the rear. The front wall portion 21 of the frame 20 has, on a front face thereof, a pair of protruding portions 21a and 21b which protrude toward the front. The protruding portions 21a and 21b are disposed on the lower side of the projecting portion 41a of the lower cover 40. In particular, the front face portion 41 of the lower cover 40 engages with the protruding portions 21a and 21b of the frame 20. In this manner, only one of the front face portion 41, the side face portions 42 and the rear face portion 43 of the lower cover 40 (in the present example, the rear face portion 43) is fixed to the frame 20 by screws while the remaining ones (the front face portion 41 and the side face portions 42) engage with the frame 20.

As depicted in FIG. 5(a), a structure similar in general to the side face portions 42 of the lower cover 40 is provided on one of the side face portions 32 of the upper cover 30 (in the present example, the right side face portion). In particular, on the one side face portion 32, a plurality of engaging portions 32a which individually fit in the recessed portions 22e (refer to FIG. 2) formed on the side face portion 22 of the frame 20. The frame 20 of the example described here has a projecting portion 22c which projects from the side face portion 22 toward the outer side in the leftward and rightward direction and extends in the forward and rearward direction (refer to FIG. 2). The projecting portion 22c opposes to the projecting portion 22a described hereinabove in the upward and downward direction. The recessed portions 22e in which the engaging portions 32a engage are formed on an end face of the projecting portion 22c. Further, the side face portion 32 of the upper cover 30 has, on an inner face thereof, substantially L-shaped engaging portions 32b. The projecting portion 22c of the frame 20 has, at an end portion thereof, a flange portion 22d which projects upwardly. The flange portion 22d is fitted with the engaging portions 32b of the upper cover 30. By an action of the two binds of engaging portions 32a and 32b, movement of the side face portion 32 of the upper cover 30 with respect to the side face portion 22 of the frame 20 is restricted. It is to be noted that the engagement structure provided on the side face portion 32 is not limited to that described above.

As depicted in FIG. 5, on the other side wall portion 32 of the upper cover 30 (in the present example, the left side face portion), two kinds of engaging portions 32c and 32d are formed such that they project to the inner side. The engaging portions 32c engage with an upper edge of the flange portion 22d of the projecting portion 22c formed on the left side face portion 22 of the frame 20 (refer to FIG. 5(b)). The engaging portions 32c are formed for elastic deformation. Meanwhile, the engaging portions 32d are not formed for elastic deformation. The engaging portions 32d are fitted in holes formed on an end face of the projecting portion 22c. By an action of the engaging portions 32c and 32d, movement of the left side face portion 32 of the upper cover 30 with respect to the side face portion 22 of the frame 20 (movement in the forward and rearward direction and the upward and downward direction) is restricted.

The upper cover 30 of the example described here can be separated from each other in the leftward and rightward direction as depicted in FIG. 7. In particular, the upper cover 30 has a right cover 30R and a left cover 30L. The right cover 30R is fixed to the main body 10 by screws. In particular, the attachment holes 33a described hereinabove are provided on the right, cover 30R. Meanwhile, projecting portions 30a and 30b are formed on an edge of the right cover 30R. An attachment hole 30d for a screw is formed in the projecting portions 30a, and the projecting portions 30a are fixed to an upper face of the main body 10 (in the example described herein, on the shield 5a which covers the circuit board 5). Further, the projecting portions 30a and 30b are elastically deformable, and the engaging portions 30c formed on an edge of the left cover 30L engage with the projecting portions 30a and 30b. In a state in which the edge of the left cover 30L connects to the right cover 30R, the projecting portions 30a and 30b are covered with the right cover 30R as depicted in FIG. 2. Therefore, the screws for fixing the projecting portions 30a to the main body 10 are not exposed on the upper face of the electronic apparatus 1.

The left cover 30L can be removed by canceling the engagement thereof with the right cover 30R and with the side face portion 22 of the frame 20. The left cover 30L covers a region in which the hard disk drive 6 is provided as depicted in FIG. 2. By removing the left cover 30L, the hard disk drive 6 is exposed and can be exchanged. If is to be noted that no screw is used for fixation of the left cover 30L. The upper cover 30 need not necessarily have the right cover 30R and the left cover 30L which can be separated from each other in the leftward and rightward direction.

The front wall portion 21 of the frame 20 has, on the front face thereof, a plurality of protruding portions 21c which project toward the front (refer to FIG. 2). The front face portion 31 of the upper cover 30 has, on a lower edge thereof, a projecting portion in the form of a plate which projects toward the rear. The protruding portions 21c are disposed on the lower side of the projecting portion of the upper cover 30. In particular, the front face portion 31 of the upper cover 30 is caught by the protruding portions 21c of the frame 20 similarly to the front face portion 41 of the lower cover 40.

As depicted in FIG. 1, a gap is provided between the lower edge of the peripheral face portion (the front face portion 31, the side face portions 32 and the rear face portion 33) of the upper cover 30 and the peripheral face portion (the front face portion 41, the side face portions 42 and the rear face portion 43) of the lower cover 40. The wall portions 21, 22 and 23 of the frame 20 are partially exposed through the gap. At the exposing portions, apertures 21f (refer to FIG. 3) for exposing the insertion slot 21e for an optical disk and the connectors 1, intake holes 22f and so forth are formed. Consequently, the upper cover 30 and the lower cover 40 can be simplified in shape, and the appearance of the electronic apparatus can be improved. In the example described here, the insertion slot 21e for an optical disk and the apertures 21f for exposing the connectors 7 therethrough are formed in the front wall portion 21 of the frame 20 as shown in FIG. 3.

The intake holes 22f are formed in the side face portions 22. More particularly, each side face portion 32 has the projecting portions 22a and 22c described hereinabove (refer to FIG. 5). A plurality of intake holes 22f are formed in each of the projecting portions 22a and 22c and juxtaposed in the forward and rearward direction. The intake holes 22f extend through the projecting portions 22a and 22c in the upward and downward direction. Each of the side face portions 42 of the lower cover 40 is disposed only on the outer side of the projecting portion 22a and engages with the projecting portion 22a. Consequently, an air flow path extending along the inner face of the lower cover 40 (a flow path formed on the lower side of the main body 10) is formed. Each of the side face portions 32 of the upper cover 30 is disposed on the outer side of the projecting portion 22c and engages with the projecting portion 22c. Accordingly, an air flow path extending along the inner face of the upper cover 30 (a flow path formed on the upper side of the main body 10) is formed. Air taken in from the intake holes 22f passes along the upper side and the lower side of the main body 10 and flows to the cooling fan 3 (refer to FIG. 6). It is to be noted that, by forming the intake holes 22f in the projecting portions 22a and 22c, the intake holes 22f can be suppressed from being viewed by the user. In the example described here, a gap is provided also between the front face portion 31 of the upper cover 30 and the front wall portion 21 of the frame 20. A gap is provided also between the front face portion 41 of the lower cover 40 and the front wall portion 21 of the frame 20. The gaps mentioned function as intake holes. Such gaps may not necessarily be provided.

As described hereinabove, the cooling fan 3 and the optical disk drive 4 are disposed on the inner side of the peripheral wall portion (the wall portions 21, 22 and 23) of the frame 20. The frame 20 has a portion which covers the parts disposed in the inner side of the peripheral wall portion in the upward and downward direction. In particular, the frame 20 has a portion which covers the upper side or the lower side of the parts disposed on the inner side of the peripheral wall portion. The frame 20 of the example described here has a part cover portion 24 which covers the upper side of the optical disk drive 4 as depicted in FIG. 3. The part cover portion 24 is molded integrally with the other part of the frame 20 such as the peripheral wall portion. By providing such a part cover portion 24 as just described particular, the optical disk drive 4 has, on the upper side thereof, a transport mechanism (not depicted) for an optical disk including a gear wheel and so forth. It is unnecessary to provide a cover which covers such a transport mechanism as just described on the optical disk drive 4. Further, the part cover portion 24 is connected to the front wall portion 21 and a side face portion 22 of the frame 20. By the connection, the rigidity of the frame 20 can be improved. In the example described here, the part cover portion 24 supports the hard disk drive 6 disposed on the upper side thereof.

The cooling fan 3 is disposed such that the center line of rotation thereof is directed in the upward and downward direction. The frame 20 has a fan cover portion 25 which covers the lower side of the cooling fan 3 and surrounds the outer periphery of the cooling fan 3. The fan cover portion 25 is formed integrally with the peripheral wall portion of the frame 20. In particular, in the example described here, the peripheral wall portion, the part cover portion 24 described above and the fan cover portion 25 are formed integrally with each other. The fan cover portion 25 has a bottom face portion 25a which covers the lower side of the cooling fan 3 and a side face portion 25b which surrounds the outer periphery of the cooling fan 3. The bottom face portion 25a has an opening 25c formed thereon and positioned below the cooling fan 3. When the cooling fan 3 is driven, air flows to the inner side of the fan cover portion 25 through the opening 25c. As depicted in FIG. 4, a heat sink 8 is disposed on the lower side of the circuit board 5 and is thermally coupled to the integrated circuits mounted on the circuit board 5. Also the heat sink 8 is disposed on the inner side of the fan cover portion 25. In the example described here, the heat sink 8 is disposed behind the cooling fan 3. The circuit board 5 is disposed so as to cover the upper side of the cooling fan 3. An air flow path is defined by the fan cover portion 25 and the circuit board 5. By defining the air flow path utilizing part of the frame 20 in this manner, the number of parts can be reduced.

As depicted in FIG. 4, an exhaust port 23a is formed in the rear wall portion 23 of the frame 20. The power supply unit 2 is disposed between the rear wall portion 23 and the fan cover portion 25. The fan cover portion 25 is open rearwardly. A case 2a of the power supply unit 2 has an opening 2d (refer to FIG. 3) on the front face. The opening 2d is connected to a rear edge of the fan cover portion 25. The case 2a of the power supply unit 2 has a vent hole 2e on a front face thereof (a face opposing to the rear wall portion 23 of the frame 20).

As depicted in FIG. 5, air F3 discharged to the outer periphery of the cooling fan 3 by driving of the cooling fan 3 flows in a peripheral direction of the cooling fan 3 along the flow path defined by the fan cover portion 25 and the circuit board 5. Thereafter, the air flows rearwardly in the fan cover portion 25 as indicated by F4 in FIG. 6 and passes the heat sink 8. Then, the air passes the case 2a of the power supply unit 2 and is discharged to the rear side of the electronic apparatus 1 past the vent hole 2e and the exhaust port 23a as indicated by F5 in FIG. 6. It is to be noted that, a plurality of louvers are formed in the exhaust port 23a of the rear wall portion 23 of the frame 20 and the vent hole 2e of the case 2a. Consequently, the circuit board in the case 2a can be suppressed from being viewed through the exhaust port 23a and the vent hole 2e.

A plurality of apertures 43b for exposing the exhaust port 23a therethrough are formed in the rear face portion 43 of the lower cover 40. The plurality of apertures 43b are juxtaposed in the leftward and rightward direction. Further, a poser supply connector 2f is provided on the rear face of the power supply unit 2. A recessed portion 23b for exposing the power supply connector 2f is formed at a lower edge of the rear wall portion 23 of the frame 20f and an aperture 43c for exposing the power supply connector 2f is formed in the rear face portion 43 of the lower cover 40. Further, on the rear wall portion 23 of the frame 20, connectors 5b mounted on the circuit board 5 are exposed. A plurality of apertures 33c are formed also in the rear face portion 33 of the upper cover 30, and the connectors 5b are exposed to the rear side through the apertures 33c.

The frame 20 has the side wall portions 22 opposing to each other in the leftward and rightward direction. The case 2a of the power supply unit 2 is a substantially parallelepiped shape. The width of the case 2a in the leftward and rightward direction corresponds to the distance between the left and right side wall portions 22. The case 2a is attached to the side wall portions 22 by screws. By fixing such a case 2a as just described to the frame 20, the overall rigidity can be improved.

As described hereinabove, the power supply unit 2, the cooling fan 3 and the optical disk drive 4 are disposed on the inner side of the peripheral wall portion (the wall portions 21, 22 and 23) of the frame 20. On the other hand, the circuit board 5 and the shield 5a are attached to the upper side of the peripheral wall portion (the front wall portion 21, the side wall portions 22 and the rear wall portion 23) of the frame 20 (refer to FIG. 2). Where the circuit board 5 is laid out in this manner, the circuit board 5 having a comparatively great size can be utilized without increasing the size of the frame 20. Further, by disposing the circuit board 5 on the upper side of the frame 20, the cooling performance of the electronic apparatus 1 can be improved in comparison with an alternative case in which the circuit board 5 is disposed on the lower side of the frame 20. As depicted in FIG. 2, a plurality of protrusions 20a projecting upwardly are formed on the frame 20. The circuit board 5 and the shield 5a are positioned by the protrusions 20a. It is to be noted that the position of the circuit board 5 is not limited to that described above. The circuit board 5 may be disposed on the inner side of the frame 20 or may be disposed on the lower side of the frame 20.

The electronic apparatus 1 is assembled, for example, in the following procedure. First, the upper cover 30, lower cover 40 and frame 20 are prepared. Parts to be provided in the electronic apparatus 1 are attached to the frame 20. In particular, the cooling fan 3 is disposed, on the inner side of the fan cover portion 25 and fixed to the frame 20 by screws. Further, the optical disk drive 4 is disposed on the inner side of the part cover portion 24 and fixed to the frame 20 by screws. Furthermore, the lower side shield, circuit board 5 and upper side shield 5a are disposed in this order on the upper side of peripheral wall portion of the frame 20 and are fixed by screws. At this time, the heat sink 8 connected to the integrated circuits of the circuit board 5 is disposed on the inner side of the fan cover portion 25, and the power supply unit 2 is disposed on the inner side of the peripheral wall portion from the lower side of the frame 20 and fixed to the frame 20 by screws (the power supply unit 2 is fitted between and fixed to the rear wall portion 23 and the fan cover portion 25). By the procedure, the main body 10 is obtained.

Thereafter, the lower side of the main body 10 is covered with the lower cover 40, and the main body 10 is fixed by screws. In particular, the rear face portion 43 of the lower cover 40 is fixed to the rear wall portion 23 of the frame 20 by screws. Further, the engaging portions 42a and 42b provided on the side face portions 42 of the lower cover 40 are engaged with the side face portion 22 of the frame 20.

Further, the upper side of the main body 10 is covered with the upper cover 30, and the upper cover 30 is fixed by screws. In particular, the right cover 30R is disposed on the upper side of the main body 10 and the rear face portion 33 is fixed to the rear wall portion 23 of the frame 20 by screws. Further, the projecting portions 30a of the right cover 30R are fixed to the main body 10 (particularly to the upper side shield 5a). Thereafter, the left cover 30L is connected to the right cover 30R. In particular, the engaging portions 30c of the left cover 30L are fitted between adjacent two ones of the projecting portions 30b of the right cover 30R so as to be engaged with each other. Further, the engaging portions 32c and 32d provided on the side face portions 32 of the left cover 30L are engaged with the side face portions 22 of the frame 20. The foregoing is an example of the assembling procedure of the electronic apparatus 1.

As described above, the frame 20 has the peripheral wall portion (the wall portions 21, 22 and 23) formed along the outer peripheral face (the front face, the left, and right side faces and the rear face) of the electronic apparatus 1. To the frame 20, a plurality of parts built in the electronic apparatus 1 (in the foregoing description, the power supply unit 2, the cooling fan 3, the circuit board 5 and the optical disk drive 4) are attached. The parts mentioned for implementing the functions which the electronic apparatus 1 has such as reproduction of a moving picture are disposed on the inner side of the region defined by the outer profile of the peripheral wall portion (the outer profile of the tube) when the frame 20 is viewed in the upward and downward direction. Further, the portion exposed from the frame 20 is covered with the upper cover 30 and the lower cover 40. In particular, the upper cover 30 has the upper face portion 39 which covers the upper side of the frame 20 and the parts described hereinabove and configures the upper face of the electronic apparatus 1, and the peripheral face portion (the front face portion 31, the side face portions 32 and the rear face portion 33) which configures the outer peripheral face of the electronic apparatus 1. Further, the lower cover 40 has the lower face portion 49 which covers the lower side of the frame 20 and the parts described above and configures the lower face of the electronic apparatus 1, and the peripheral face portion (the front face portion 41, the side face portions 42 and the rear face portion 43) which configures the outer peripheral face of the electronic apparatus 1.

The peripheral face portion of the upper cover 30 (more particularly, the rear face portion 33) is attached to the peripheral wall portion of the frame 20 (more particularly, to the rear wall portion 23) by screws. The peripheral face portion of the lower cover 40 (more particularly, the rear face portion 43) is attached to the peripheral wall portion of the frame 20 (more particularly, the rear wall portion 23) by screws. With such an electronic apparatus 1 as just described, the insertion locations of the screws can be suppressed from being exposed on the upper face and the lower face of the electronic apparatus. As a result, in any of the state in which the electronic apparatus 1 is disposed such that the upper face thereof is directed upwardly and the state in which the upper face and the lower face are directed in the horizontal direction (in the case where the electronic apparatus is placed vertically), the insertion locations of the screws can be suppressed from standing out. Further, the parts such as the power supply unit 2, cooling fan 3 and circuit board 5 are attached to the frame 20. The peripheral wall portion is provided on the frame 20, and the rigidity of the frame 20 is assured. Therefore, in comparison with the conventional structure wherein the parts such as the circuit board 5 are attached to an exterior member (in the conventional structure, the housing), the number of screws to be used for fixation of the exterior members (in the present embodiment, the covers 30 and 40) can be reduced. As a result, the screws can be suppressed from standing out.

Further, the front wall portion 21, the side wall portions 22 and the rear wall portion 23 of the frame 20 have a portion exposed between the lower edge of the upper cover 30 and the upper edge of the lower cover 40. With the structure just described, the intake holes 22f and the insertion slot 21e for an optical disk can be provided at the exposed portion. As a result, the shape of the covers 30 and 40 can be simplified, and the appearance of the electronic apparatus can be improved readily.

It is to be noted, that the present invention is not limited to the electronic apparatus 1 described above and various modifications are possible.

For example, the frame 20 may not necessarily have the part cover portion 24 and the fan cover portion 25.

Further, the intake holes 22f may be provided at positions different from those of the projecting portions 22a and 22c. Further, the projecting portions 22a and 22c may have an air discharging aperture formed therein in place of the intake holes.

Further, the covers 30 and 40 may be attached to a side face portico 22 of the frame 20 by screws.

Further, the fixtures to be used for attachment of the covers 30 and 40 are not necessarily screws.

Further, the wall portion to which the upper cover 30 is attached and the wall, portion to which the lower cover 40 is attached may be different from each other.

Further, a gap stay not be provided between the lower of the upper cover 30 and the lower edge of the lower cover 40. In this case, the frame 20 may not be exposed on the side faces, the front face or the rear face of the electronic apparatus 1.

Further, the peripheral wall portion which configures the frame 20 may not have a quadrangular shape as viewed in the upward and downward direction. For example, the peripheral wall portion may have a circular shape or a triangular shape as viewed in the upward and downward direction.

Further, the two covers may individually cover a plurality of parts provided in the electronic apparatus and the right side and the left side of the main body of the electronic apparatus configured from a frame. In this case, the peripheral wall portion of the frame may be formed along the front face, upper face, rear face and lower face of the electronic apparatus. Further, the peripheral face portion of the cover may configure the front face, the upper face, the rear face and the lower face of the electronic apparatus.

The invention claimed is:

1. An electronic apparatus including a first face, a second face which is a face on an opposite side to the first face, and an outer peripheral face which is a face which surrounds the electronic apparatus when the electronic apparatus is viewed in a first direction which is a direction in which the first face and the second face oppose to each other, the electronic apparatus comprising;
   a first cover having a first face portion which configures the first face and covers a plurality of parts built in the electronic apparatus and a peripheral face portion which configures the outer peripheral face of the electronic apparatus;
   a second cover having a second face portion which configures the second face and covers the plurality of parts and a peripheral face portion which configures the outer peripheral face of the electronic apparatus; and
   a frame having a peripheral wall portion formed along the outer peripheral face of the electronic apparatus and surrounding the plurality of parts and having the plurality of parts attached thereto;
   the peripheral face portion of the first cover including a portion located from the frame in a second direction orthogonal to the first direction and an attachment hole formed in the portion;
   the frame having an attachment hole corresponding to the attachment hole of the first cover;
   the peripheral face portion of the first cover being fixed to the frame by a fixture inserted in the attachment hole of the first cover and the attachment hole of the frame.

2. The electronic apparatus according to claim 1, wherein the peripheral wall portion of the frame has a portion which is exposed between an edge of the first cover and an edge of the second cover which oppose to each other in the first direction.

3. The electronic apparatus according to claim 2, wherein the exposed portion of the frame has formed thereon at least one of an insertion slot for an optical disk, an aperture for exposing a connector therethrough and a vent hole.

4. The electronic apparatus according to claim 1, wherein the frame has a portion on an inner side of the peripheral wall portion thereof, the portion covering at least one of the plurality of parts in the first direction.

5. The electronic apparatus according to claim 4, wherein a cooling fan is disposed on the inner side of the peripheral wall portion of the frame; and
the portion of the frame covers the cooling fan in the first direction and defines a flow path for an air flow formed by the cooling fan.

6. The electronic apparatus according to claim 5, wherein the portion of the frame has side wall portions which surrounds an outer periphery of the cooling fan.

7. The electronic apparatus according to claim 1, wherein the peripheral face portion of the first cover includes a plurality of face portions surrounding the peripheral wall portion of the frame,
the portion of the peripheral face portion of the first cover that has the attachment hole is one of the plurality of face portions,
the other of the plurality of face portions have no attachment hole to which a fixture is inserted.

8. The electronic apparatus according to claim 1, wherein the peripheral face portion of the second cover includes a plurality of face portions surrounding the peripheral wall portion of the frame,
one of the plurality of face portions of the second cover has an attachment hole formed therein,
a fixture is inserted into the attachment hole of the one of the plurality of face portions and an attachment hole formed in the peripheral wall portion of the frame,
the other of the plurality of face portions have no attachment hole to which a fixture is inserted.

9. The electronic apparatus according to claim 1, wherein a circuit board is attached to the frame; and
the circuit board is located from the peripheral wall portion of the frame in the first direction.

10. The electronic apparatus according to claim 1, wherein
the peripheral wall portion of the frame has a tubular shape; and
the frame has, at part thereof on an inner side of the peripheral wall portion, a portion which covers the plurality of parts surrounded by the peripheral wall portion and is open, at other part thereof on the inner side of the peripheral wall portion, to one side in the first direction and an opposite side to the one side.

11. The electronic apparatus according to claim 1, wherein
the peripheral wall portion of the frame has a tubular shape; and
the frame has, on an inner side of the peripheral wall portion, a portion which covers a first part, which is one of the plurality of parts, on one side in the first direction and a portion which covers a second part, which is another one of the plurality of parts, on the opposite side in the first direction.

12. A fabrication method for an electronic apparatus including a first face, a second face which is a face on an opposite side to the first face, and an outer peripheral face which is a face which surrounds the electronic apparatus when the electronic apparatus is viewed in a first direction which is a direction in which the first face and the second face oppose to each other, the fabrication method comprising:
preparing a first cover having a first face portion for configuring the first face and a peripheral face portion for configuring the outer peripheral face of the electronic apparatus;
preparing a second cover having a second face portion for configuring the second face and a peripheral face portion for configuring the outer peripheral face of the electronic apparatus;
preparing a frame having a peripheral wall portion formed so as to extend along the outer peripheral face of the electronic apparatus;
disposing a plurality of parts on an inner side of the peripheral wall portion and attaching the plurality of parts to the frame;
covering the plurality of parts and the frame with the first cover;
covering the plurality of parts and the frame with the second cover; and
inserting a fixture into an attachment hole formed in the peripheral face portion of the first cover and located from the frame in a second direction orthogonal to the first direction and an attachment hole formed in the peripheral wall portion of the frame to fix the peripheral face portion of the first cover to the peripheral wall portion of the frame by the fixture.

13. An electronic apparatus including a first face, a second face which is a face on an opposite side to the first face, and an outer peripheral face which is a face which surrounds the electronic apparatus when the electronic apparatus is viewed in a first direction which is a direction in which the first face and the second face oppose to each other, the electronic apparatus comprising:
a first cover having a first face portion which configures the first face and covers a plurality of parts built in the electronic apparatus and a peripheral face portion which configures an outer peripheral face of the electronic apparatus;
a second cover having a second face portion which configures the second face and covers the plurality of parts and a peripheral face portion which configures the outer peripheral face of the electronic apparatus; and
a frame having a peripheral wall portion formed along the outer peripheral face of the electronic apparatus and surrounding the plurality of parts and having the plurality of parts attached thereto;
the outer peripheral face of the electronic apparatus including a front face, a left side face, a right side face and a rear face;
each of the peripheral face portion of the first cover and the peripheral face portion of the second cover including a front face portion, a left side face portion, a right side face portion and a rear face portion which configure the front face, the left side face, the right side face and the rear face of the outer peripheral face portion of the electronic apparatus, respectively;

wherein only the rear face portion from among the front face portion, the left side face portion, the right side face portion and the rear face portion of the first cover being fixed to the peripheral wall portion of the frame by a fixture.

14. The electronic apparatus according to claim 13, wherein
at least one of the front face portion, the left side face portion and the right side face portion of the first cover has an engaging portion for engaging with the peripheral wall portion of the frame; and
at least one of the front face portion, the left side face portion and the right side face portion of the second cover has an engaging portion for engaging with the peripheral wall portion of the frame.

15. The electronic apparatus according to claim 13, wherein
a gap is provided between the front face portion of the first cover and the front face portion of the second cover;
the peripheral wall portion of the frame has at least one of an insertion slot for an optical disk and a connector; and
at least one of the insertion slot for an optical disk and the connector is exposed from the gap and is provided at a position recessed with respect to the front face portion of the first cover and the front face portion of the second cover.

16. The electronic apparatus according to claim 13, wherein
an exhaust port is provided in the peripheral wall portion of the frame; and
an aperture for exposing the exhaust port therethrough is formed at least at one of the rear face portion of the first cover and the rear face portion of the second cover.

17. The electronic apparatus according to claim 13, wherein
a connector is provided on the peripheral wall portion of the frame; and
an aperture for exposing the connector therethrough is formed at least at one of the rear face portion of the first cover and the rear face portion of the second cover.

18. The electronic apparatus according to claim 1, wherein
a circuit board is attached to the frame and covered with one of the first cover and the second cover.

19. The fabrication method according to claim 12, further comprising attaching a circuit board to the frame and covering the circuit board with one of the first cover and the second cover.

20. The electronic apparatus according to claim 13, wherein
a circuit board is attached to the frame and covered with one of the first cover and the second cover.

21. The electronic apparatus according to claim 1, wherein
the peripheral face portion of the first cover includes a third face portion located from the frame in the second direction and having the attachment hole formed in the third face portion, and includes a fourth face portion located from the frame in a third direction orthogonal to the first direction and the second direction, the fourth face portion including an engaging portion formed in the fourth face portion and engaging with the frame,
the peripheral face portion of the first cover is fixed to the frame by a fixture inserted in the attachment hole of the first cover and the attachment hole of the frame and by the engaging portion of the fourth face portion of the first cover.

22. The fabrication method according to claim 12, wherein
the peripheral face portion of the first cover includes a third face portion located from the frame in the second direction and a fourth face portion located from the frame in a third direction orthogonal to the first direction and the second direction, wherein the third face portion has the attachment hole formed therein, and the fourth face portion includes an engaging portion formed therein,
the fabrication method comprises
engaging the engaging portion of the fourth face portion of the first cover with the frame, inserting the fixture into the attachment hole formed in the peripheral face portion of the first cover and the attachment hole formed in the peripheral wall portion of the frame to fix the peripheral face portion of the first cover to the peripheral wall portion of the frame by the fixture and the engaging portion.

23. The electronic apparatus according to claim 13, wherein
at least one of the left side face portion and the right side face portion includes an engaging portion for engaging with the frame,
the peripheral face portion of the first cover is fixed to the frame by the fixture and the engaging portion.

* * * * *